US012684729B2

(12) United States Patent
Wang

(10) Patent No.: US 12,684,729 B2
(45) Date of Patent: Jul. 14, 2026

(54) PUSHING AUXILIARY

(71) Applicant: FIVEGRAND INTERNATIONAL CO., LTD., New Taipei City (TW)

(72) Inventor: Ting-Jui Wang, New Taipei City (TW)

(73) Assignee: FIVEGRAND INTERNATIONAL CO., LTD., New Taipei City (TW)

( * ) Notice: Subject to any disclaimer, the term of this patent is extended or adjusted under 35 U.S.C. 154(b) by 861 days.

(21) Appl. No.: 17/886,485

(22) Filed: Aug. 12, 2022

(65) Prior Publication Data

US 2023/0068205 A1　Mar. 2, 2023

(30) Foreign Application Priority Data

Aug. 26, 2021　(TW) ................................. 110131669

(51) Int. Cl.
　　*H05K 7/18*　　　(2006.01)
　　*H05K 7/14*　　　(2006.01)
(52) U.S. Cl.
　　CPC ............. *H05K 7/18* (2013.01); *H05K 7/1409* (2013.01); *H05K 7/1412* (2013.01)

(58) Field of Classification Search
　　CPC .......................... F16B 21/10–14; F16B 21/02; F16B 2200/67; G06F 1/183–188; H05K 5/0221; H05K 7/1409; H05K 7/1411; H05K 7/1412
　　See application file for complete search history.

(56) References Cited

U.S. PATENT DOCUMENTS 5,208,735 A * 5/1993 Twachtmann ....... H05K 7/1411
　　　　　　　　　　　　　　　　　　403/18
2016/0219745 A1* 7/2016 Loparco ............... H05K 7/1405

* cited by examiner

*Primary Examiner* — Tyrone V Hall, Jr.

(57) ABSTRACT

A pushing auxiliary includes a body part and a screw body. The body part includes an abutting part and a combination part, the combination part is movably combined with an object; the screw body is movably combined with the body part, and the screw body is screwed with a nut body of another object for driving the abutting part to abut against an abutted body, in order to drive the object to move. Accordingly, the pushing auxiliary of the present disclosure has the effects of simplicity of operation, saving labor and convenience.

4 Claims, 10 Drawing Sheets

PUSHING AUXILIARY

CROSS-REFERENCE TO RELATED APPLICATION

This non-provisional application claims priority under 35 U.S.C. § 119(a) on Patent Application No(s). 110131669 filed in Taiwan, R.O.C. on Aug. 26, 2021, the entire contents of which are hereby incorporated by reference.

BACKGROUND OF THE INVENTION

1. Field of the Invention

The present disclosure provides a pushing auxiliary, and in particular to a pushing auxiliary that is easy-handling, labor-saving and convenient.

2. Description of the Related Art

The traditional rack is usually equipped with an offload mechanism, the function of the offload mechanism is to separate the hard disk or circuit board from a port configured in the rack, the user rotates the offload mechanism, and the hard disk or circuit board will be pushed up and displaced, and then detached from the port. However, the offload mechanism of the traditional rack can only displace the hard disk or circuit board by a short distance, because of the rack partition or adjacent side-by-side devices, it results in difficult and inconvenient access for users.

BRIEF SUMMARY OF THE INVENTION

In view of the shortcomings of the above-mentioned prior art, the inventor developed a pushing auxiliary, with a view to achieving the purposes of simplicity of operation, saving labor and convenience.

To achieve the above objective and other objectives, the present disclosure provides a pushing auxiliary, comprising: a body part and a screw body. The body part includes an abutting part and a combination part, the combination part is movably combined with an object; the screw body is movably combined with the body part, and the screw body is screwed with a nut body of another object for driving the abutting part to abut against an abutted body, in order to drive the object to move.

In the above-mentioned pushing auxiliary, the body part includes a first body part and a second body part, the first body part is movably combined with the second body part by a combining part, the screw body is movably combined to the second body part.

In the above-mentioned pushing auxiliary, there is a movement space between the first body part and the second body part, so that the second body part is movably abutted against the first body part.

In the above-mentioned pushing auxiliary, the second body part vertically moves to bring the first body part to rotate.

In the above-mentioned pushing auxiliary, because the first body part and the second body part abut with each other, the combining part moves within the movement space, or moves at two ends of the movement space.

In the above-mentioned pushing auxiliary, the body part has a handle, the handle operates the body part after the screw body is disengaged from the nut body.

In the above-mentioned pushing auxiliary, there is a floating amount between the screw body and the body part to screw with the screw body in different angles or oblique angles.

In the above-mentioned pushing auxiliary, the screw body screws with the nut body in an oblique angle.

In the above-mentioned pushing auxiliary, the nut body is assembled to an assembling body, there is a floating amount between the assembling body and the nut body to make the screw body and the nut body floated and moved at screwing, or screw the screw body in different angles or oblique angles.

In the above-mentioned pushing auxiliary, there is an elastic element between the screw body and the body part, the elastic element makes the screw body carry out an elastic motion.

In the above-mentioned pushing auxiliary, the screw body includes a head and a screw thread part, the screw thread part is screwed with the nut body.

In the above-mentioned pushing auxiliary, the pushing auxiliary further comprises an assembling body, the assembling body is movably combined with the screw body, and the assembling body is combined to the body part.

In the above-mentioned pushing auxiliary, the nut body is disposed in the object.

In the above-mentioned pushing auxiliary, the nut body is disposed in the other object.

In the above-mentioned pushing auxiliary, the object has a connector, the connector is connected to another connector of a connecting object by on-state current, when the screw body is screwed up, the pushing auxiliary abuts against the abutted body to bring the object to move, so that the connector is loosened or disengaged from the other connector.

In the above-mentioned pushing auxiliary, the object has a connector, the connector is connected to another connector of a connecting object by on-state current, when the screw body is screwed up, the pushing auxiliary abuts against the abutted body to bring the object to move, so that the hot-swappable connector is loosened or disengaged from the other connector.

In the above-mentioned pushing auxiliary, the object, the other object or the abutted object is a printed circuit board, motherboard, chassis, computer case, radiator, slide rail, cabinet, disk body, cage, air-cooled structure, water-cooled structure, structure immersed in water-cooled liquid, server structure or storage structure.

In the above-mentioned pushing auxiliary, the screw body has a blocking part to abut or stop the body part, used to push and abut the body part with a screwing force when screwing with the nut body, in order to drive the blocking part to push and abut the abutted body and drive the object to move.

In the above-mentioned pushing auxiliary, the pushing auxiliary further comprises an assembling body, the assembling body is movably combined with the nut body, and there is a floating amount between the assembling body and the nut body.

In the above-mentioned pushing auxiliary, the screw body pushes and abuts or blocks against the body part, used to push and abut the body part with a screwing force when screwing with the nut body, in order to drive the abutting part to push and abut the abutted body and drive the object to move.

In the above-mentioned pushing auxiliary, the screw body includes a head and a screw thread part, a motion journey of the screw body in the body part is less than a screwing motion journey of the screw thread part in the nut body, so that the screw thread part is pushed and abutted to the body part with a screwing force of the nut body to drive the abutting part to abut against the abutted body, in order to drive the object to move.

In the above-mentioned pushing auxiliary, a motion journey of the screw body in the body part is less than a screwing motion journey of the screw thread part in the nut body, so that the screw thread part is pushed and abutted to the body part by a blocking part with a screwing force of the nut body to drive the abutting part to abut against the abutted body, in order to drive the object to move.

In the above-mentioned pushing auxiliary, the screw body includes a head, a screw thread part and a blocking part, wherein the blocking part and the screw thread part are integrally formed, or the blocking part is movably provided in the screw body, or the blocking part is a screw thread part.

In the above-mentioned pushing auxiliary, the screw body includes a head, a local position of the head has a tool operation part.

In the above-mentioned pushing auxiliary, the screw body includes a head and a screw thread part.

In the above-mentioned pushing auxiliary, the body part has an orbital space, the screw body is movably disposed in the orbital space, so that the orbital space acts as a floating space of the screw body, allowing the screw body to screw in the orbital space of the body part to bring the body part to rotate, so that the abutting part is driven to abut against the abutted body to drive the object to move.

In the above-mentioned pushing auxiliary, the orbital space is an arc surface or a curved surface, for carrying out a rotational movement with the screw body.

In the above-mentioned pushing auxiliary, the screw body is a screw stem body or a nut body.

In the above-mentioned pushing auxiliary, the screw body includes a head, a screw thread part, a barrel and a limiting part, the head is disposed on the barrel, the barrel is movably combined with the limiting part, the screw thread part is disposed on the limiting part, and the limiting part is movably disposed in the orbital space.

Accordingly, the pushing auxiliary of the present disclosure has the effects of simplicity of operation, saving labor and convenience.

DETAILED DESCRIPTION OF THE INVENTION

To facilitate understanding of the above purpose, characteristics and effects of this present disclosure, embodiments together with the attached drawings for the detailed description of the present disclosure are provided as below.

Figure 1:
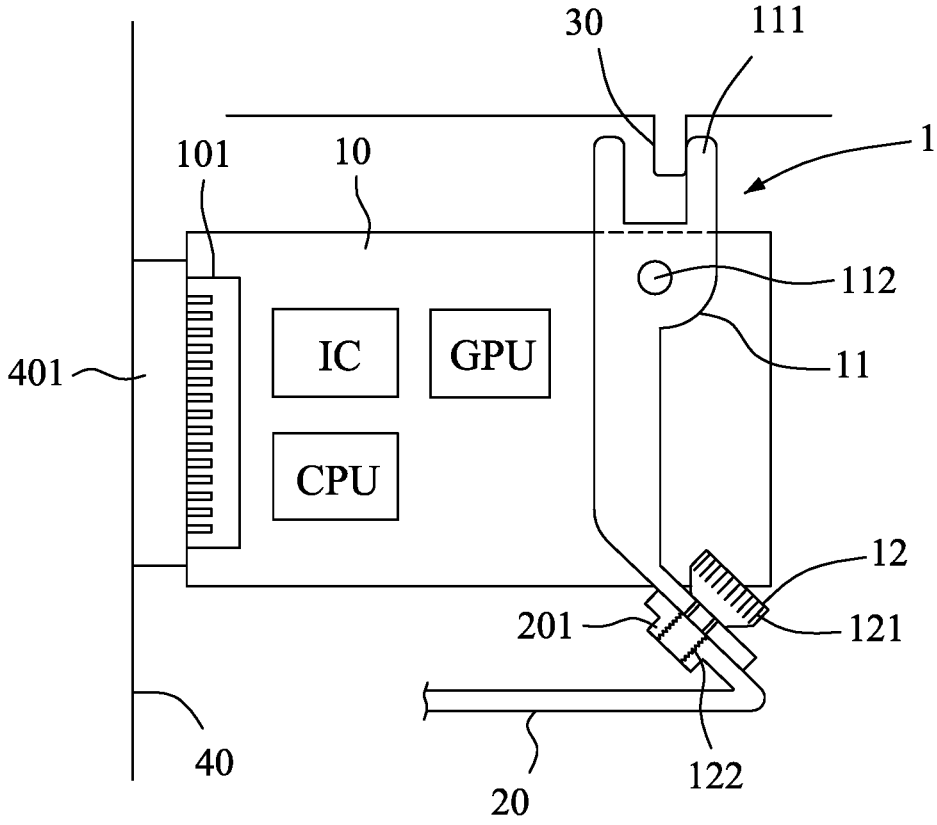
FIG. 1 is a schematic side view of a pushing auxiliary of a first embodiment of the present disclosure.
Figure 2:
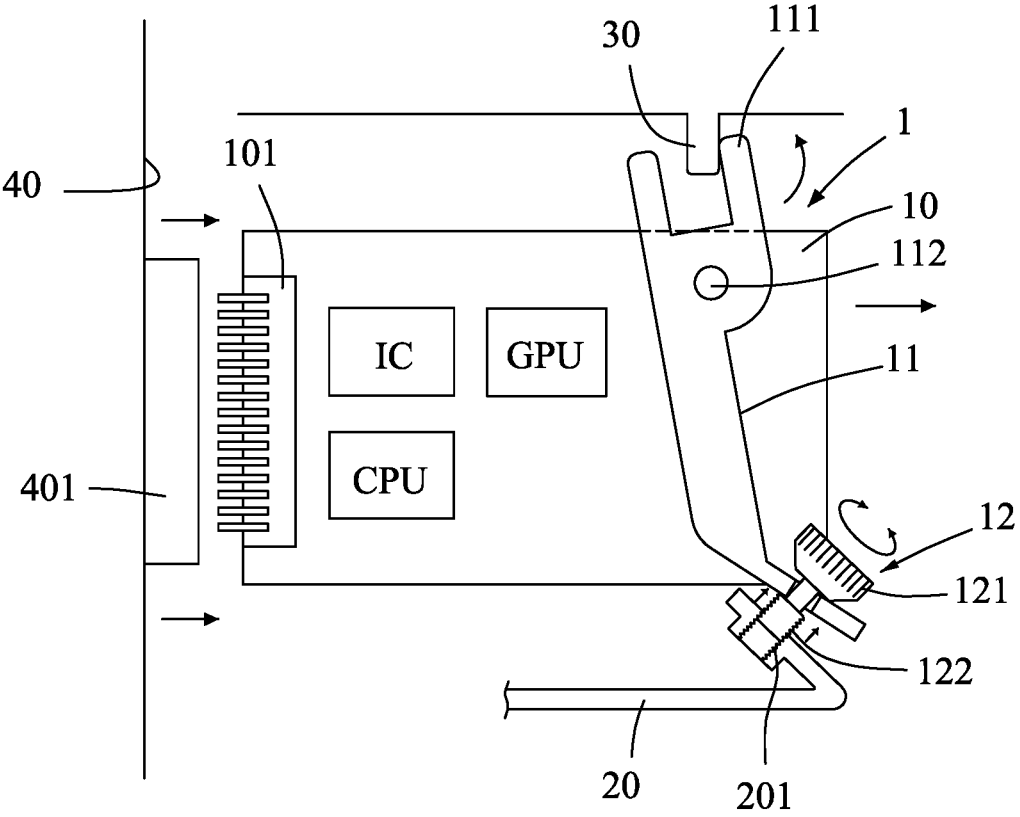
FIG. 2 is a schematic side view of a using state of the pushing auxiliary of the first embodiment of the present disclosure.

Referring to FIGS. 1 and 2, as shown in the drawings, the present disclosure provides a pushing auxiliary, the pushing auxiliary 1 comprises: a body part 11 and a screw body 12.

The body part 11 includes an abutting part 111 and a combination part 112, the combination part 112 is movably combined with an object 10.

The screw body 12 is movably combined with the body part 11, and the screw body 12 is screwed with a nut body 201 of another object 20 for driving the abutting part 111 to abut against an abutted body 30, in order to drive the object 10 to move.

When used, the pushing auxiliary 1 may be movably combined with the object 10 by the combination part 112, and the nut body 201 is disposed in the other object 20, and the screw body 12 is used to screw with the nut body 201 of the other object 20, and the abutting part 111 is abutted against the abutted body 30, in order to use the cooperation of the body part 11 and the screw body 12, and the object 10, the other object 20 and the abutted body 30 are combined with each other; when the object 10, the other object 20 and the abutted body 30 are disengaged, the screw body 12 may be rotated, so that the screw body 12 moves within the nut body 201 to drive the body part 11 to abut and push the abutted body 30 with the abutting part 111, and at the same time the combination part 112 brings the object 10, so that the object 10 and the other object 20 are separated from the abutted body 30, thereby achieving the effects of simplicity of operation, saving labor and convenience.

In one embodiment of the present disclosure, the screw body 12 includes a head 121 and a screw thread part 122, the screw thread part 122 is screwed with the nut body 201, so that the screw body 12 constitutes a screw stem body. Thus, when the combination or separation of the screw body 12 and the nut body 201 are operated, force may be applied to the head 121, so that the head 121 is linked to the screw thread part 122 and the nut body 201 to combine or separate in a screwing manner, thereby achieving the effects of simplicity of operation, saving labor and convenience.

In one embodiment of the present disclosure, a motion journey of the screw body 12 in the body part 11 is less than a screwing motion journey of the screw thread part 122 in the nut body 201, so that the screw thread part 122 is pushed and abutted to the body part 11 with a screwing force of the nut body 201 to drive the abutting part 111 to abut against the abutted body 30, in order to drive the object 10 to move, thereby achieving the effects of simplicity of operation, saving labor and convenience.

In one embodiment of the present disclosure, the screw body 12 is screwed with the nut body 201 in an oblique angle. Thus, according to the setting positions of the object 10, the other object 20 and the abutted body 30, the nut body 201 goes with the setting of the screw body 12 in an oblique angle, in order to avoid the formation of mutual interference between the mechanisms when operating the screw body 12, thereby achieving the effect of simplicity of operation.

In one embodiment of the present disclosure, the object 10 has a connector 101, the connector 101 is connected to another connector 401 of a connecting object 40 by on-state current, when the screw body 12 is screwed up, the pushing auxiliary 1 abuts against the abutted body 30 to bring the object 10 to move, so that the hot-swappable connector 101 is loosened or disengaged from the other connector 401.

Accordingly, the screw body 12 may be screwed with the nut body 201 of the other object 20, and the abutting part 111 is abutted against the abutted body 30, in order to use the cooperation of the body part 11 and the screw body 12 to make the object 10, the other object 20 and the abutted body 30 combined with each other, and at the same time the connector 101 of the object 10 is connected to the other connector 401 of the connecting object 40 by on-state current; when the object 10, the other object 20, the abutted body 30, the connector 101 and the other connector 401 are disengaged, the screw body 12 may be rotated, so that the screw body 12 moves within the nut body 201 to drive the body part 11 to abut and push the abutted body 30 by the abutting part 111, in order to bring the object 10 to move, so that the hot-swappable connector 101 is loosened or disengaged from the other connector 401, and at the same time the combination part 112 brings the object 10, so that the object 10 and the other object 20 are separated from the abutted body 30, thereby achieving the effects of simplicity of operation, saving labor and convenience.

In one embodiment of the present disclosure, the object 10, the other object 20 or the abutted body 30 may be a printed circuit board, motherboard, chassis, computer case, radiator, slide rail, cabinet, disk body, cage, air-cooled structure, water-cooled structure, structure immersed in water-cooled liquid, server structure or storage structure. Accordingly, the present disclosure can further meet the needs of practical application.

In one embodiment of the present disclosure, the screw body 12 pushes and abuts or blocks against the body part 11, used to push and abut the body part 11 with a screwing force when screwing with the nut body 201, in order to drive the abutting part 111 to push and abut the abutted body 30 and drive the object 10 to move.

Figure 3:
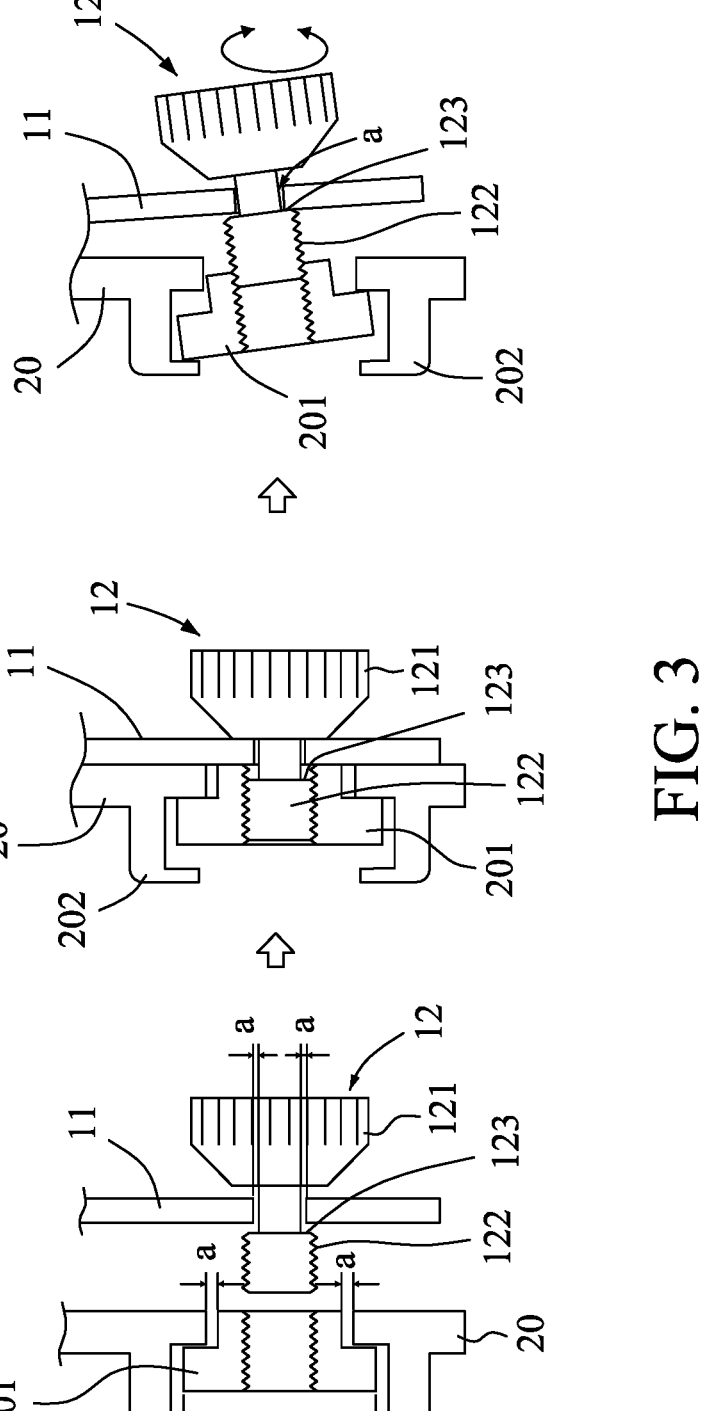
FIG. 3 is a schematic view of a using state of the pushing auxiliary of a second embodiment of the present disclosure.

As shown in FIG. 3, in one embodiment of the present disclosure, the difference from the above embodiment is that there is a floating amount a between the screw body 12 and the body part 11 to screw with the screw body 12 in different angles or oblique angles, and the nut body 201 is assembled to an assembling body 202, the assembling body 202 is movably combined with the screw body 12, and the assembling body 202 is combined with the other object 20, and there is a floating amount a between the assembling body 202 and the nut body 201 to make the screw body 12 and the nut body 201 floated and moved at screwing, or screw the screw body 12 in different angles or oblique angles, thereby achieving the effects of simplicity of operation, saving labor and convenience.

Figure 4:
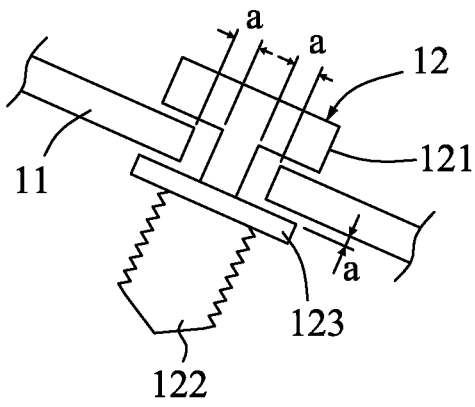
FIG. 4 is a schematic view of a using state of the pushing auxiliary of a third embodiment of the present disclosure.

Referring to FIG. 4, in one embodiment of the present disclosure, the difference with the above embodiment is that there is a floating amount a between the screw body 12 and the body part 11 to screw with the screw body 12 in different angles or oblique angles, and the screw body 12 has a blocking part 123 to abut or stop the body part 11, used to push and abut the body part 11 with a screwing force when screwing with the nut body 201, in order to drive the blocking part 123 to push and abut the abutted body 30 and drive the object 10 to move (not shown). Accordingly, the operation mode and effect described in the above embodiments can be achieved equally.

In one embodiment of the present disclosure, the screw body 12 includes a head 121, a screw thread part 122 and a blocking part 123, wherein the blocking part 123 and the screw thread part 122 are integrally formed, or the blocking part 123 is movably provided in the screw body 12, or the blocking part 123 is a screw thread part, so that the present disclosure can further meet the needs of practical application.

Figure 5:
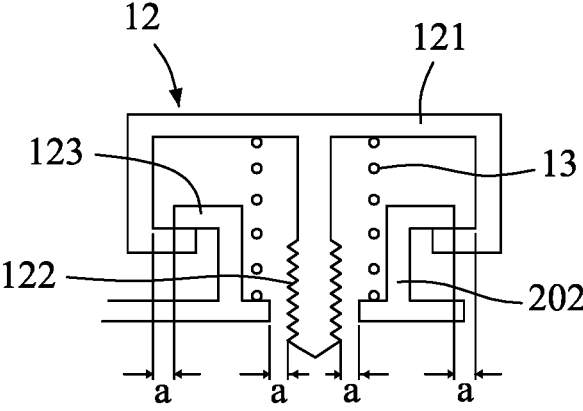
FIG. 5 is a schematic view of a using state of the pushing auxiliary of a fourth embodiment of the present disclosure.
Figure 6:
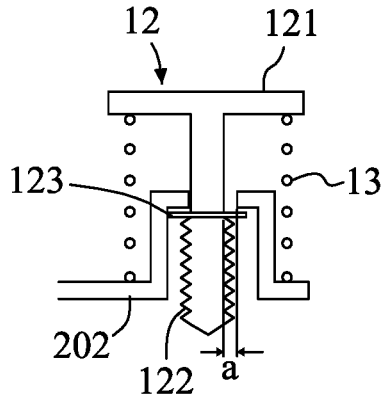
FIG. 6 is a schematic view of a using state of the pushing auxiliary of a fifth embodiment of the present disclosure.

Referring to FIGS. 5 and 6, in one embodiment of the present disclosure, the difference from the above embodiment is that there is an elastic element 13 between the screw body 12 and the body part 11, the elastic element 13 makes the screw body 12 carry out an elastic motion, and the assembling body 202 is movably combined with the screw body 12, and the assembling body 202 is combined with the body part 11, and there is a floating amount a between the screw body 12 and the assembling body 202 to make the screw body 12 floated and moved at screwing, or screw the screw body 12 in different angles or oblique angles, thereby achieving the effects of simplicity of operation, saving labor and convenience.

In one embodiment of the present disclosure, a motion journey of the screw body 12 in the body part 11 is less than a screwing motion journey of the screw thread part 122 in the nut body 201 (not shown), so that the screw thread part 122 is pushed and abutted to the body part 11 by the blocking part 123 with a screwing force of the nut body 201 to drive the abutting part 111 to abut against the abutted body 30, in order to drive the object 10 to move, so that the present disclosure can further meet the needs of practical application.

Figure 7:
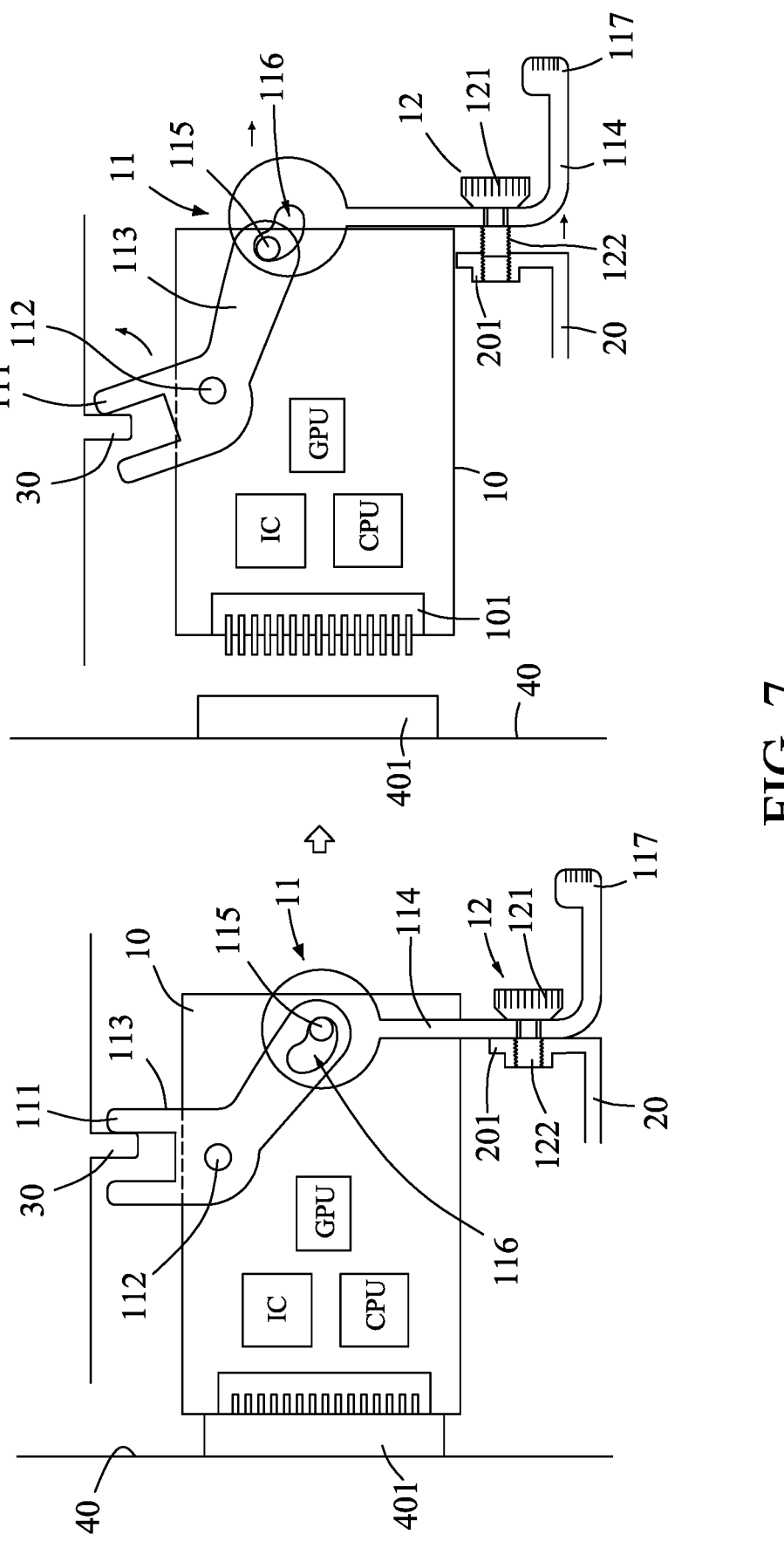
FIG. 7 is a schematic view of the pushing auxiliary of a sixth embodiment of the present disclosure.

Referring to FIG. 7, in one embodiment of the present disclosure, the difference with the above embodiment is that the body part 11 includes a first body part 113 and a second body part 114, the first body part 113 is movably combined with the second body part 114 by a combining part 115, the screw body 12 is movably combined to the second body part 114, there is a movement space 116 between the first body part 113 and the second body part 114, because the first body part 113 and the second body part 114 abut with each other, the combining part 115 moves within the movement space 116, or moves at two ends of the movement space 116, so that the second body part 114 is movably abutted against the first body part 113, and the second body part 114 has a handle 117, the handle 117 operates the second body part 114 after the screw body 12 is disengaged from the nut body 201.

Accordingly, the screw body 12 is used to screw with the nut body 201 of the other object 20, and the abutting part 111 is abutted against the abutted body 30, in order to use the cooperation of the body part 11 and the screw body 12, and the object 10, the other object 20 and the abutted body 30 are combined with each other; when the object 10, the other object 20 and the abutted body 30 are disengaged, the screw body 12 may be rotated, so that the screw body 12 moves out of the nut body 201, and force is applied to the handle 117 by a finger to make the handle 117 bring the second body part 114, and thus the second body part 114 vertically moves to bring the first body part 113 to rotate, because the first body part 113 and the second body part 114 abut with each other, the combining part 115 moves within the movement space 116, thereby driving the first body part 113 to abut and push the abutted body 30 with the abutting part 111, and at the same time the combination part 112 brings the object 10 so that the object 10 and the other object 20 are separated from the abutted body 30, thereby achieving the effects of simplicity of operation, saving labor and convenience.

Figure 8:
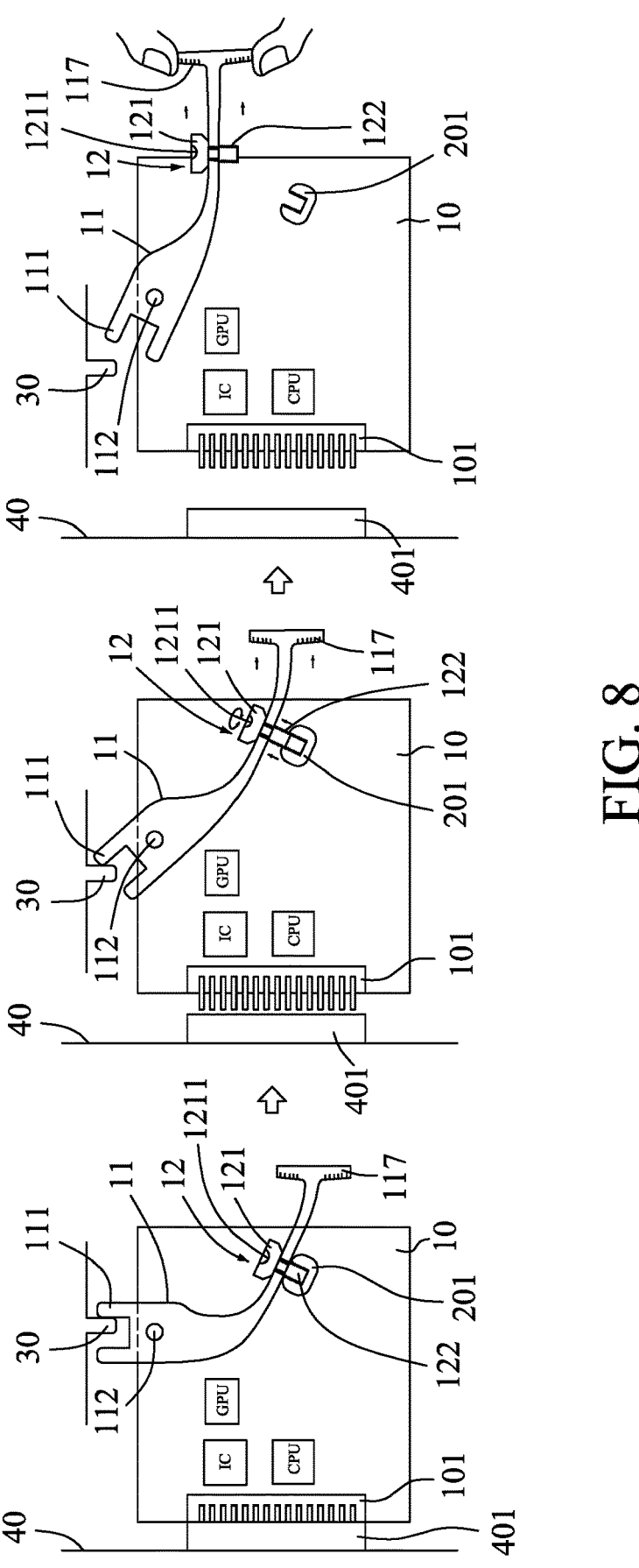
FIG. 8 is a schematic view of the pushing auxiliary of a seventh embodiment of the present disclosure.
Figure 9:
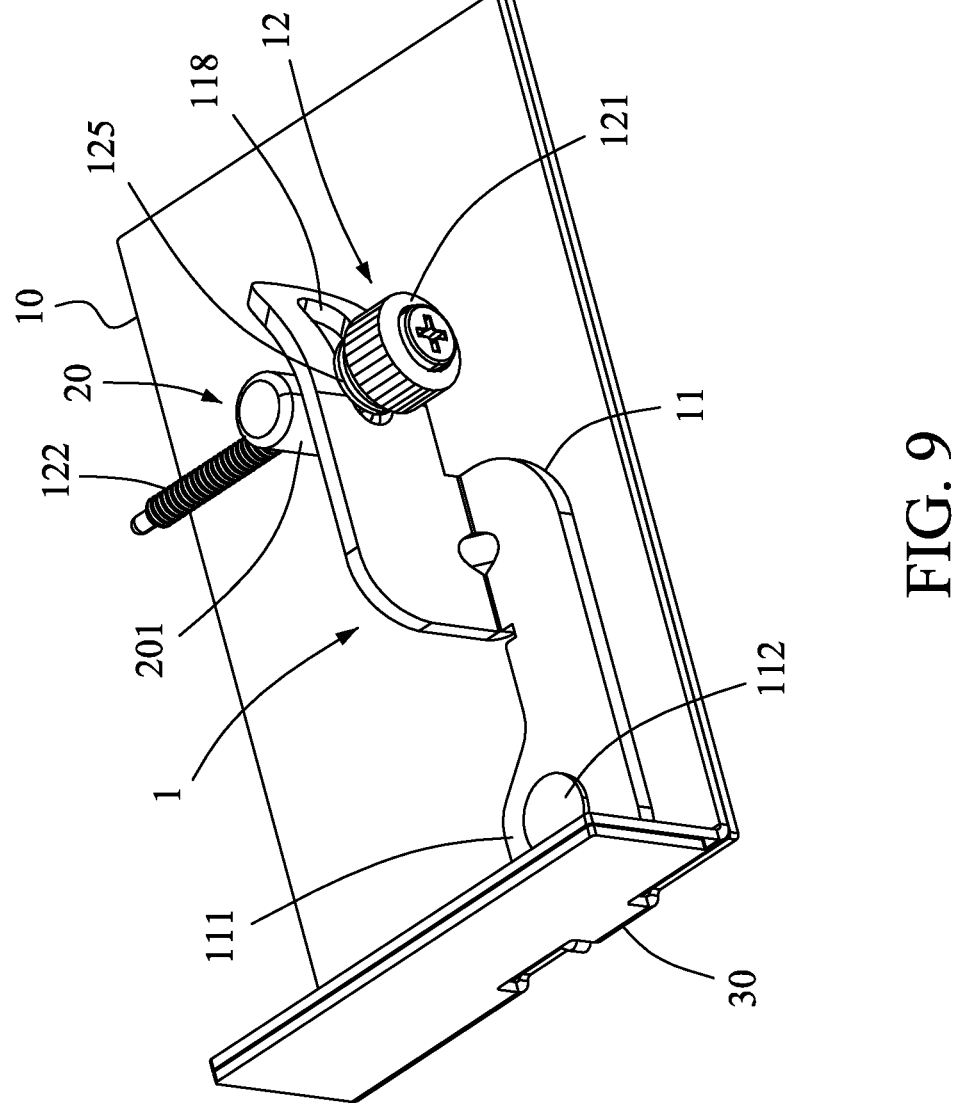
FIG. 9 is a schematic view 1 of the pushing auxiliary of an eighth embodiment of the present disclosure.
Figure 10:
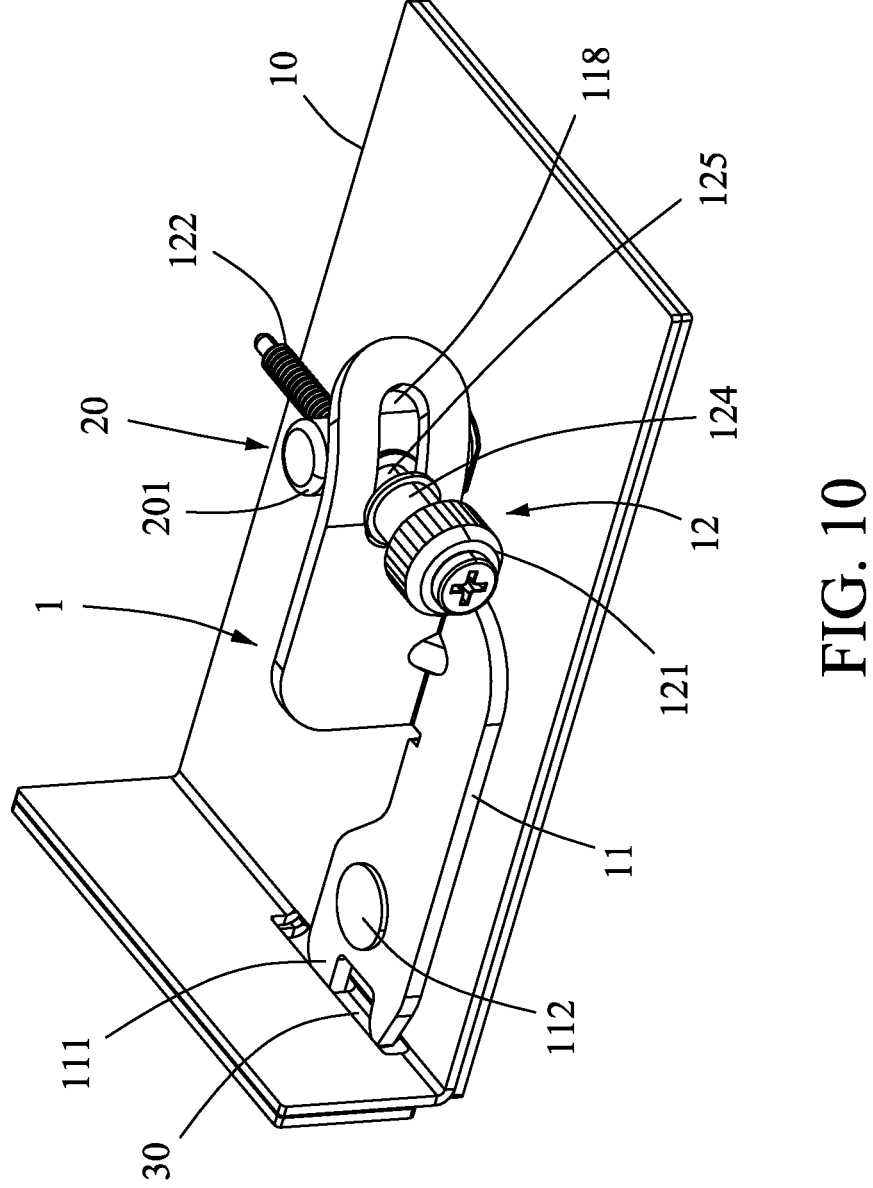
FIG. 10 is a schematic view 2 of the pushing auxiliary of the eighth embodiment of the present disclosure.
Figure 11:
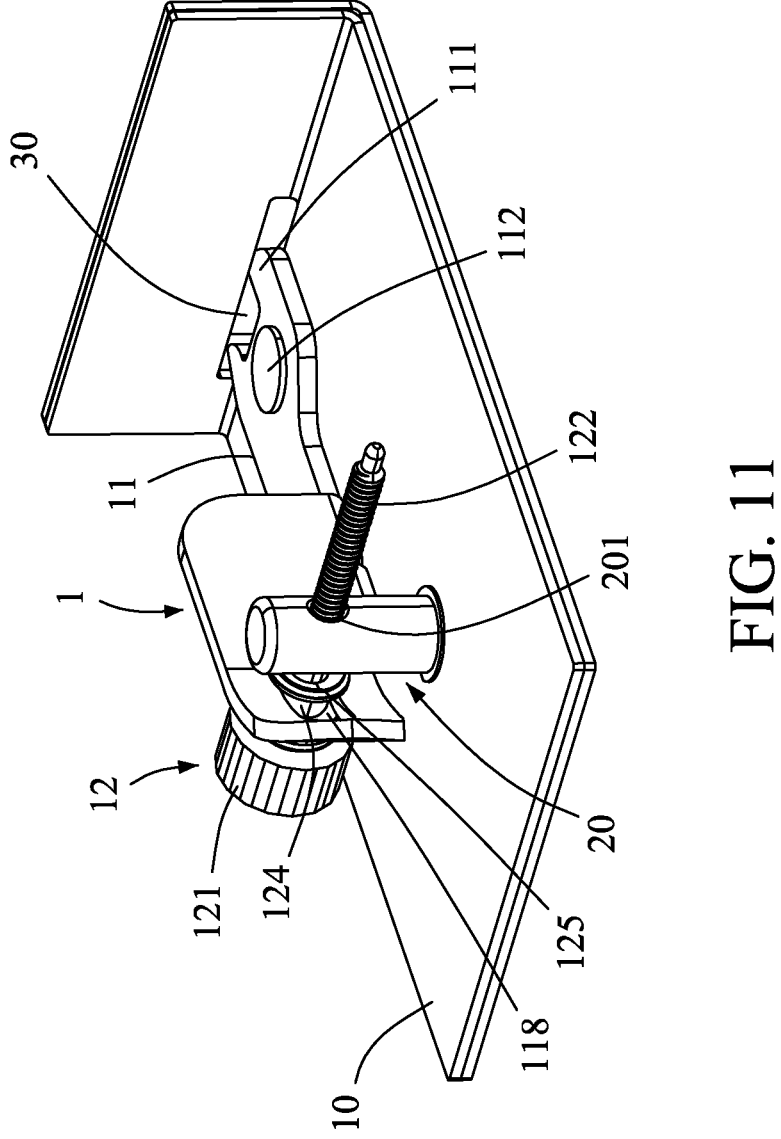
FIG. 11 is a schematic view 3 of the pushing auxiliary of the eighth embodiment of the present disclosure.
Figure 12:
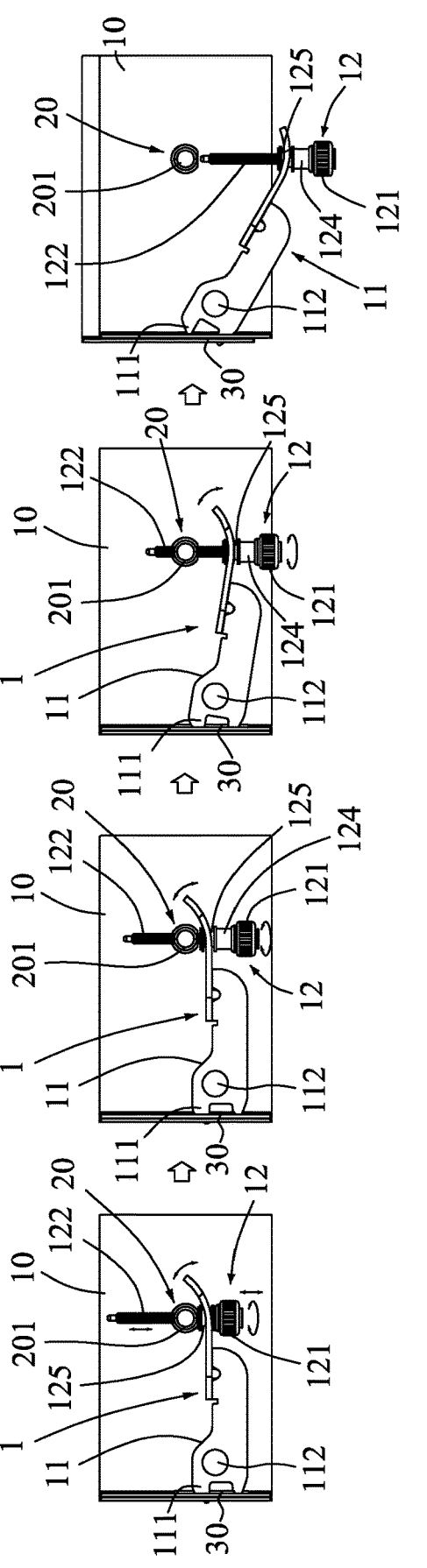
FIG. 12 is a schematic view of a using state of the pushing auxiliary of the eighth embodiment of the present disclosure.

Referring to FIG. 8, in one embodiment of the present disclosure, the difference with the above embodiment is that the nut body 201 is disposed at the object 10, and the body part has a handle 117, the handle 117 operates the body part 11 after the screw body 12 is disengaged from the nut body 201. Accordingly, the screw body 12 may be screwed with the nut body 201 on the object 10, and the abutting part 111 may be abutted against the abutted body 30, in order to use the cooperation of the body part 11 and the screw body 12, and the object 10, the other object 20 and the abutted body 30 are combined with each other; when the object 10, the other object 20 and the abutted body 30 are disengaged, the screw body 12 may be rotated, so that the screw body 12 moves out of the nut body 201, and force is applied to the handle 117 by a finger to make the handle 117 drive the body part 11 to abut and push the abutted body 30 with the abutting part 111, and at the same time the combination part 112 brings the object 10, so that the object 10 and the other object 20 are separated from the abutted body 30, thereby achieving the effects of simplicity of operation, saving labor and convenience.

In one embodiment of the present disclosure, a local position of the head 121 of the screw body 12 has a tool operation part 1211, whereby a tool (not shown) is used to cooperate the tool operation part 1211 to drive the screw body 12, so that the present disclosure can further meet the needs of practical application.

Referring to FIGS. 9 to 12, in one embodiment of the present disclosure, the difference from the above embodiment is that the body part 11 of the pushing auxiliary 1 has an orbital space 118, the screw body 12 is movably disposed in the orbital space 118, so that the orbital space 118 acts as a floating space (or moving space) of the screw body 12, allowing the screw body 12 to screw with the nut body 201 of the other object 20, and thus the screw body 12 is moved out or moved in the nut body 201, the screw body 12 is then screwed in the orbital space 118 of the body part 11 to bring the body part 11 to rotate, so that the abutting part 111 is driven to abut against the abutted body 30 to drive the object 10 to move, and at the same time the combination part 112 drives the object 10 so that the object 10 and the other object 20 are separated from the abutted body 30, thereby achieving the effects of simplicity of operation, saving labor and convenience.

In one embodiment of the present disclosure, the orbital space 118 may be an arc surface or a curved surface, for carrying out a rotational movement with the screw body 12, so that the orbital space 118 acts as a floating space (or moving space) of the screw body 12, the screw body 12 is then screwed in the orbital space 118 of the body part 11 to bring the body part 11 to rotate, so that the abutting part 111 is driven to abut against the abutted body 30 to drive the object 10 to move.

In one embodiment of the present disclosure, the screw body 12 may be a screw stem body or a nut body, the screw body 12 in the present embodiment is a screw stem body. Accordingly, the screw body 12 may be screwed with the nut body 201 of the other object 20, so that the screw body 12 is moved out or moved in the nut body 201, and then the screw body 12 is screwed in the orbital space 118 of the body part 11 to bring the body part 11 to rotate, so that the abutting part 111 is driven to abut against the abutted body 30 to drive the object 10 to move.

In one embodiment of the present disclosure, the screw body 12 includes a head 121, a screw thread part 122, a barrel 124 and a limiting part 125, the head 121 is disposed on the barrel 124, the barrel 124 is movably combined with the limiting part 125, so that the head 121 and the barrel 124 form a telescopic and fixable state, the screw thread part 122 is disposed on the limiting part 125, and the limiting part 125 is movably disposed in the orbital space 118. Accordingly, when used, the head 121 may be fixed after pulling out from the barrel 124, and force is applied to rotate the head, so that the screw thread part 122 is moved out from (or moved in) the nut body 201 to make the orbital space 118 act as a floating space (or moving space) of the limiting part 125, whereby the limiting part 125 goes with the orbital space 118 to move and bring the body part 11 to rotate, so that the body part 11 drives the abutting part 111 to abut against the abutted body 30 to drive the object 10 to move, and at the same time the combination part 112 brings the object 10 so that the object 10 and the other object 20 are separated from the abutted body 30, thereby achieving the effects of simplicity of operation, saving labor and convenience.

While the present disclosure has been described by means of preferable embodiments, those skilled in the art should understand the above description is merely embodiments of the disclosure, and it should not be considered to limit the scope of the disclosure. It should be noted that all changes and substitutions which come within the meaning and range of equivalency of the embodiments are intended to be embraced in the scope of the disclosure. Therefore, the scope of the disclosure is defined by the claims.

What is claimed is:

1. A pushing auxiliary, comprising:
a body part, including an abutting part and a combination part, the combination part is movably combined with an object; and
a screw body, movably combined with the body part, and the screw body is screwed with a nut body of another object for driving the abutting part to abut against an abutted body, in order to drive the object to move,
wherein the body part has an orbital space, the screw body is movably disposed in the orbital space, so that the orbital space acts as a floating space or a moving space of the screw body, allowing the screw body to screw or move in the orbital space of the body part to bring the body part to rotate, so that the abutting part is driven to abut against the abutted body to drive the object to move.

2. The pushing auxiliary according to claim 1, wherein the screw body screws with the nut body in an oblique angle, or there is a floating amount between the screw body and the body part to screw with the screw body in different angles or oblique angles.

3. The pushing auxiliary according to claim 1, wherein the object has a connector, the connector is connected to another connector of a connecting object by on-state current, when the screw body is screwed up, the pushing auxiliary abuts against the abutted body to bring the object to move, so that the connector is loosened or disengaged from the other connector.

4. The pushing auxiliary according to claim 1, wherein the screw body includes a head, a screw thread part, a barrel and a limiting part, the head is disposed on the barrel, the barrel is movably combined with the limiting part, the screw thread part is disposed on the limiting part, and the limiting part is movably disposed in the orbital space.

* * * * *